(12) United States Patent
Besser et al.

(10) Patent No.: US 7,749,898 B2
(45) Date of Patent: Jul. 6, 2010

(54) SILICIDE INTERCONNECT STRUCTURE

(75) Inventors: Paul R. Besser, Sunnyvale, CA (US);
Christian Lavoie, Pleasantville, NY (US); Cyril Cabral, Jr., Mahopac, NY (US); Stephen M. Rossnagel, Pleasantville, NY (US); Kenneth P. Rodbell, Sandy Hook, CT (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 12/145,163

(22) Filed: Jun. 24, 2008

(65) Prior Publication Data

US 2009/0315182 A1    Dec. 24, 2009

(51) Int. Cl.
*H01L 21/477* (2006.01)

(52) U.S. Cl. .................. 438/664; 438/675; 438/682; 257/E21.593

(58) Field of Classification Search ........... 257/E21.593
See application file for complete search history.

(56) References Cited

U.S. PATENT DOCUMENTS

| | | | | |
|---|---|---|---|---|
| 5,645,887 A | * | 7/1997 | Byun | 438/655 |
| 5,846,881 A | * | 12/1998 | Sandhu et al. | 438/683 |
| 6,323,083 B1 | * | 11/2001 | Park et al. | 438/253 |
| 6,589,867 B2 | * | 7/2003 | Schuele et al. | 438/653 |
| 6,614,116 B1 | * | 9/2003 | Hu | 257/751 |
| 6,846,734 B2 | | 1/2005 | Amos et al. | 438/592 |
| 6,927,117 B2 | | 8/2005 | Cabral, Jr. et al. | 438/233 |
| 7,029,966 B2 | | 4/2006 | Amos et al. | 438/199 |
| 7,056,782 B2 | | 6/2006 | Amos et al. | 438/199 |
| 7,122,472 B2 | | 10/2006 | Fang et al. | 438/664 |
| 7,271,455 B2 | | 9/2007 | Cabral, Jr. et al. | 257/382 |
| 2007/0059912 A1 | * | 3/2007 | Yun et al. | 438/592 |

* cited by examiner

*Primary Examiner*—Stephen W Smoot
(74) *Attorney, Agent, or Firm*—Williams, Morgan & Amerson, P.C.

(57) ABSTRACT

A method for forming an interconnect structure includes forming a dielectric layer above a first layer having a conductive region defined therein. An opening is defined in the dielectric layer to expose at least a portion of the conductive region. A metal silicide is formed in the opening to define the interconnect structure. A semiconductor device includes a first layer having a conductive region defined therein, a dielectric layer formed above the first layer, and a metal silicide interconnect structure extending through the dielectric layer to communicate with the conductive region.

16 Claims, 7 Drawing Sheets

SILICIDE INTERCONNECT STRUCTURE

CROSS-REFERENCE TO RELATED APPLICATIONS

Not applicable.

BACKGROUND

Generally, the present invention relates to the formation of integrated circuits, and, more particularly, to the formation of metallization layers including silicide interconnect structures embedded into a dielectric material.

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal-containing lines, providing the inner-level electrical connection, and a plurality of inter-level connections, also referred to as contacts or vias, filled with an appropriate highly conductive material. Contacts provide connections to devices such as transistors (e.g., connections to source, drain, or gate regions), while vias provide electrical connection between two neighboring stacked metallization layers. The metal-containing lines, contacts, and vias are commonly referred to as interconnect structures.

As the feature sizes of circuit elements in modern integrated circuits shrink, the number of circuit elements for a given chip area (i.e., packing density) increases, thereby requiring an increase in the number of electrical interconnections to provide the desired circuit functionality. Hence, the number of stacked metallization layers may increase and the dimensions of the individual lines and vias may be reduced as the number of circuit elements per chip area becomes larger. The fabrication of a plurality of metallization layers requires that issues relating to mechanical, thermal, and electrical reliability be addressed. Complex integrated circuits require conductive interconnects that can withstand moderately high current densities.

In some devices, materials such as tungsten (W) are used for contacts that interface with the transistors at the device level, also referred to as Metal1. However, as device dimensions decrease, the resistance and variability associated with tungsten also increases. Tungsten is typically deposited by means of chemical vapor deposition (CVD) technology, resulting in the possibility of an undesirable center seam and exaggerated electron-scattering-driven increases in resistivity as small dimensions. One potential replacement for tungsten is copper (Cu). Copper at the contact level provides significantly lower resistance, but raises issues with respect to barrier integrity and voiding. Copper has an affinity to react with silicon and can form copper silicide at low temperatures. Copper voiding in a contact structure may also occur due to the aggressive aspect ratios of the contacts.

Another challenge for fabricating interconnect structures is the resistance of the metal layer disposed on top of the contact. At one point, aluminum was used, but current devices typically employ copper formed using a damascene process. In a damascene process, a dielectric layer is formed over the underlying conductive feature. Openings are etched into the dielectric layer to expose the conductive feature, and the openings are filled with metal (e.g., with copper). Copper is a low resistance material, but it must be contained using barrier materials such as tantalum and tantalum nitride disposed between the copper and the surrounding dielectric material to prevent unwanted out-diffusion of copper into the dielectric, or else in-diffusion of moisture or oxygen, causing copper oxidation. The barrier thickness does not scale with the device dimensions, as a minimum thickness is required to establish the barrier. Thus, as the line width of the copper feature is reduced, the ratio of the cross-sectional area of the copper to the cross-sectional area of the line decreases, which rapidly increases the overall resistance.

As device dimensions continue to decrease, the width of the metal lines is approaching the mean free path of electrons in copper (i.e., 37 nm). Electrons in copper of line widths near this dimension will experience scattering from the sidewalls and surfaces, and with smaller grain sizes the grain boundary component will be higher. These scattering events also increase the resistance of the copper.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method for forming an interconnect structure. The method includes forming a dielectric layer above a first layer having a conductive region defined therein. An opening is defined in the dielectric layer to expose at least a portion of the conductive region. A metal silicide is formed in the opening to define the interconnect structure.

Another aspect of the disclosed subject matter is seen in a semiconductor device including a first layer having a conductive region defined therein, a dielectric layer formed above the first layer, and a metal silicide interconnect structure extending through the dielectric layer to communicate with the conductive region.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1A:
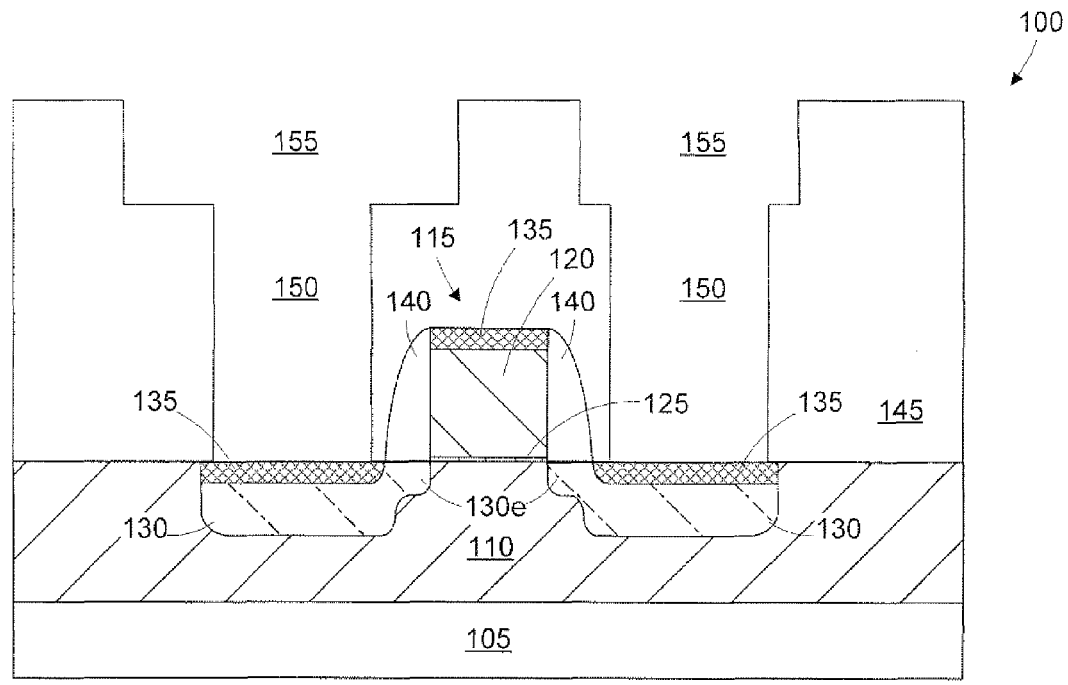
FIGS. 1a-1f are cross-section views illustrating the formation of a metal silicide interconnect structure accordance with one embodiment of the present subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIGS. 1a-1f, the disclosed subject matter shall be described in the context a semiconductor device 100. The semiconductor device 100 includes a substrate 105 upon which a semiconductor layer 110 is formed. The substrate 105 may comprises a bulk substrate or a silicon-on-insulator (SOI) substrate that employs an active layer formed over a buried insulator layer (not shown). A transistor 115 is formed in and on the semiconductor layer 110. The transistor 115 includes a gate electrode 120 separated from the semiconductor layer 110 by a gate insulation layer 125. Active regions, such as drain/source regions 130 may be formed within the semiconductor layer 110. Extension regions 130e may also be provided for advanced field effect transistors. Metal silicide regions 135 may be formed in the drain/source regions 130 and on the gate electrode 120. Spacers 140 may be formed at the sidewalls of the gate electrode 120 for tailoring the shape and spacing of the drain/source regions 130 and/or the silicide regions 135 with respect to the gate electrode 120. An interlayer dielectric (ILD) layer 145 is formed over the transistor 115 and contact openings 150 are defined in the ILD layer 145. Trench openings 155 are also defined in the ILD layer 145 in accordance with commonly employed dual damascene processing.

The processes for forming the device 100 shown in FIG. 1a are known to those of ordinary skill in the art, and for ease of illustration and to avoid obscuring the present subject matter, they are not described in greater detail herein. Moreover, other features not illustrated may also be employed in the device 100. For example, stressed materials in the form of contact etch stop layers, spacers, or recessed regions may be formed to provide intrinsic stress in the channel region of the transistor 115 to affect charge carrier mobility. In addition one or more etch stop layers (not shown) may be employed to facilitate the formation of the contact openings 150 and/or trench openings 155 to reduce the likelihood for damaging the underlying materials.

Figure 1B:
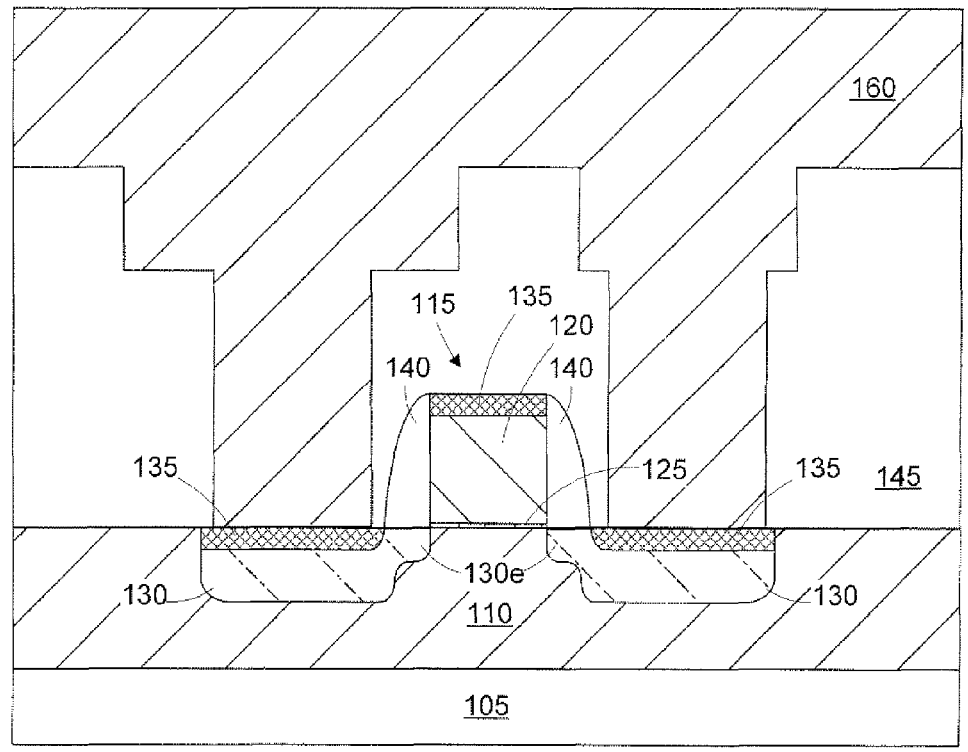
Figure 1C:
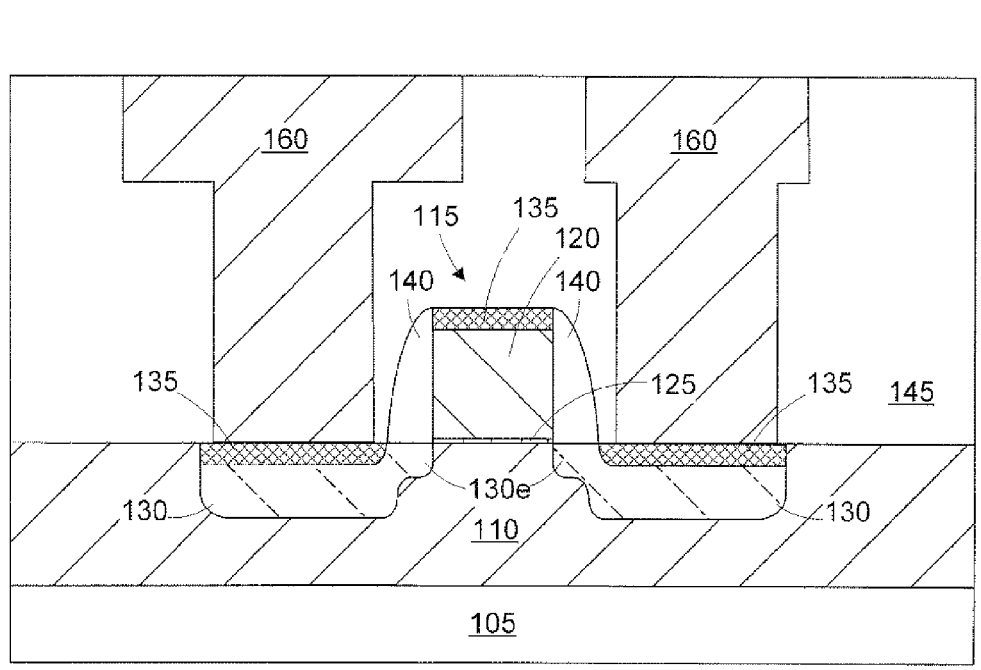

As shown in FIG. 1b, a silicon layer 160 is formed over the ILD layer 145 using a process such as chemical vapor deposition (CVD). The silicon layer 160 may take the form of polysilicon or amorphous silicon. The silicon layer 160 fills the openings 150, 155. Subsequently, a planarization process, such as chemical mechanical planarization (CMP), is employed as shown in FIG. 1c to remove portions of the silicon layer 160 extending beyond the trench opening 155. The thickness of the silicon layer 160 may be controlled depending on the dimensions of the transistor 115, the ILD layer 145, and the openings 150, 155 to provide for adequate fill.

Figure 1D:
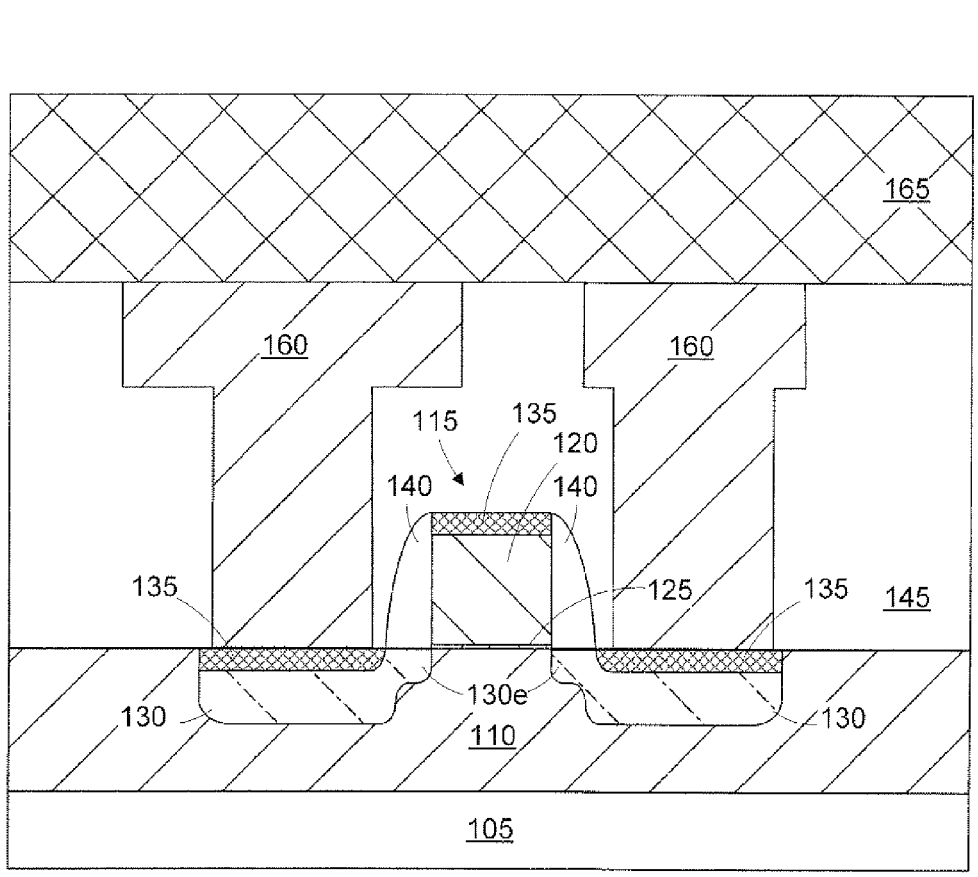

Turning now to FIG. 1d, a metal layer 165 is formed over the ILD layer 145 and remaining portions of the silicon layer 160 utilizing a deposition process including, but not limited to, sputtering, evaporation, plating, CVD, atomic layer deposition, or chemical solution deposition. In the illustrated embodiment, the metal layer 165 is nickel, and is used in a salicide process to convert the material of the silicon layer 160 to nickel silicide. However, the metal layer 165 may be formed using any metal that is capable of forming a metal silicide when in contact with silicon and subjected to annealing. Suitable metals include, but are not limited to, cobalt, titanium, tungsten, molybdenum, tantalum, platinum, palladium, copper, and the like. In addition metal alloys may also be used.

A base metal, such as nickel or cobalt may include 0.1 to 50 atomic % of at least one additive. An exemplary, but not exhaustive list of such additives (i.e., which may be provided during the process to form the metal layer 165 or implanted at a subsequent step) include carbon, aluminum, titanium, vanadium, chromium, manganese, iron, cobalt, nickel, copper, germanium, zirconium, niobium, molybdenum, ruthenium, rhodium, palladium, silver, indium, tin, hafnium, tantalum, tungsten, rhenium, iridium, and platinum, with the assumption that the alloy additive is not the same as the base metal. Mixtures of one or more of these additives are also contemplated. In some embodiments, a nickel-platinum alloy may be used. The amount of platinum may depend on factors such as stability and/or cost. For example, an exemplary, but not limiting, range may be from 1-20% platinum. A capping layer, such as titanium nitride, may be provided over the metal layer 165 to act as an oxygen diffusing barrier during the silicidation anneal.

Depending on the particular metal or metal alloy selected for the metal layer 165 and subsequent conversion to silicide, a barrier may be useful for lining the openings. In such cases, the openings 150, 155 may be lined with a barrier material (not shown), such as tantalum, titanium, nitrides thereof, or other barrier materials prior to filling the openings with the silicon layer 160. Although such a barrier material is not illustrated, it is contemplated that one may be provided.

The thickness of the metal layer 165 may range from about 10 nm to about 500 nm, depending on the particular metal chosen and the dimensions of the openings 150, 155 (i.e., the thickness of the ILD layer 145). Those of ordinary skill in the art are familiar with thickness ratios required to achieve full silicidation of the silicon material. For example, the ratio of silicon thickness to metal thickness for nickel monosilicide is 1.83, while that of platinum monosilicide is 1.97.

Figure 1E:
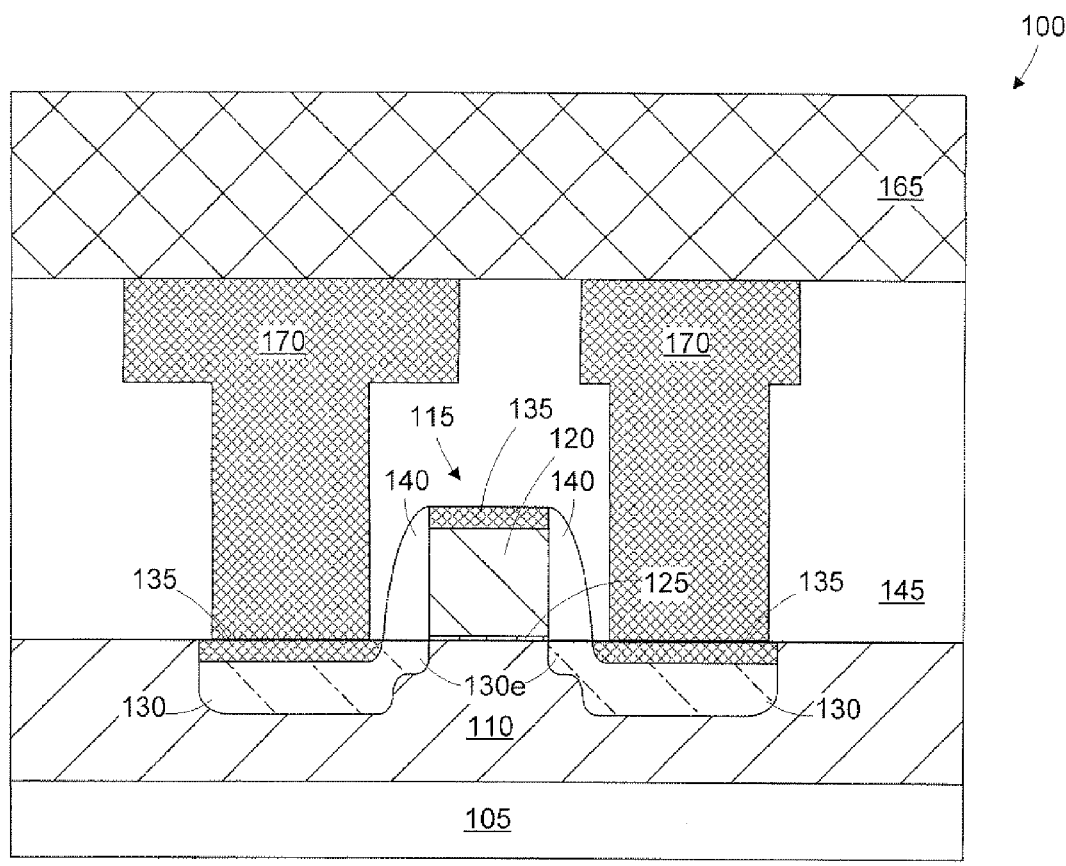

The semiconductor device 100 is subjected to an annealing process in FIG. 1e to convert the material of the silicon layer 160 to a metal silicide 170. The particular form of silicide may vary depending on the metal selected and the characteristics of the annealing process. In the illustrated embodiment, when nickel is selected as the metal layer 165, the annealing is controlled so that nickel monosilicide is formed. Of course, other silicide phases known to those in the art may also be used, such as disilicide or metal-rich silicides, depending on the particular application. The temperature and time parameters of the anneal process may be controlled to form the intended silicide material and phase, as is know to those of ordinary skill in the art.

The anneal process may be performed in a rapid thermal processing tool or a furnace, and the anneal time and temperature may vary. For example, the anneal time may range from 0 seconds for a spike anneal to 60 seconds in an RTP tool, while the anneal time in a furnace may range from 10-30 minutes. Temperatures for the anneal process may range from about 300-500° C. for nickel monosilicide formation, and again the particular temperature may vary depending on the material selected and the silicide phase desired. The higher temperatures allow formation of silicide with limited stress, as silicon becomes more mobile, thereby reducing the stress-inducing effects of volume expansion.

Figure 1F:
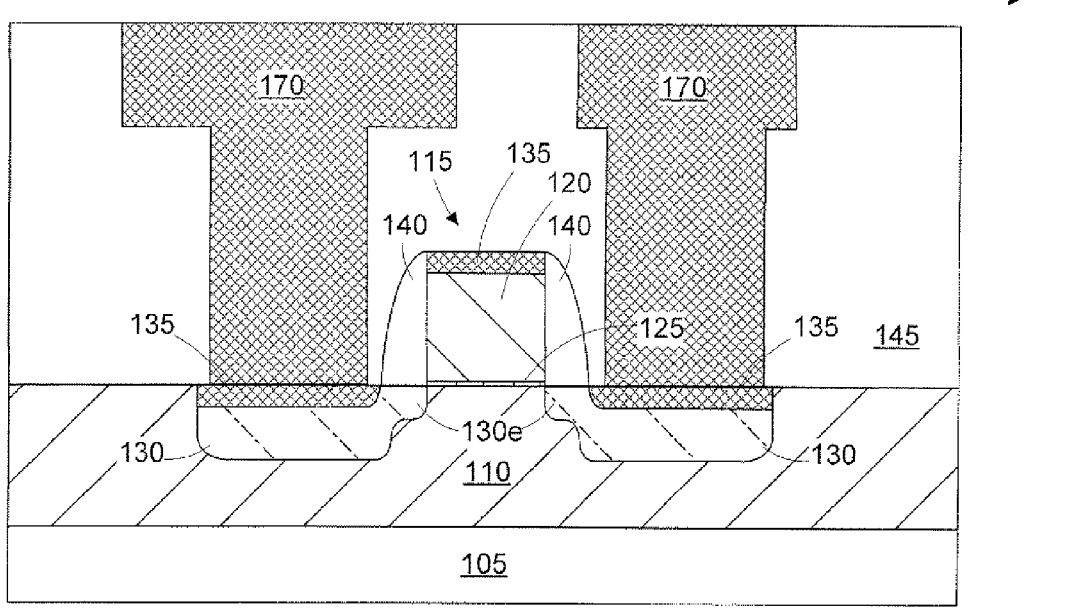

Following the completion of the silicide process in FIG. 1e, a material removal process, such as a wet etch may be performed to remove unreacted portions of the metal layer 165, as shown in FIG. 1f. For example, a sulfuric acid and $H_2O_2$ etch (SPM) followed by treatment with an APM solution comprised of $NH_4OH$, $H_2O_2$, and water may be used to remove the unreacted metal.

An additional anneal may be performed after the etch to lower the resistivity of the metal silicide 170 and/or to convert one phase to another in a two-step process. For example, a metal rich silicide may be formed during the first anneal and, following the etch to remove the unreacted metal, a more silicon rich phase may be formed by further annealing to consume the remainder of the silicon.

Figure 2A:
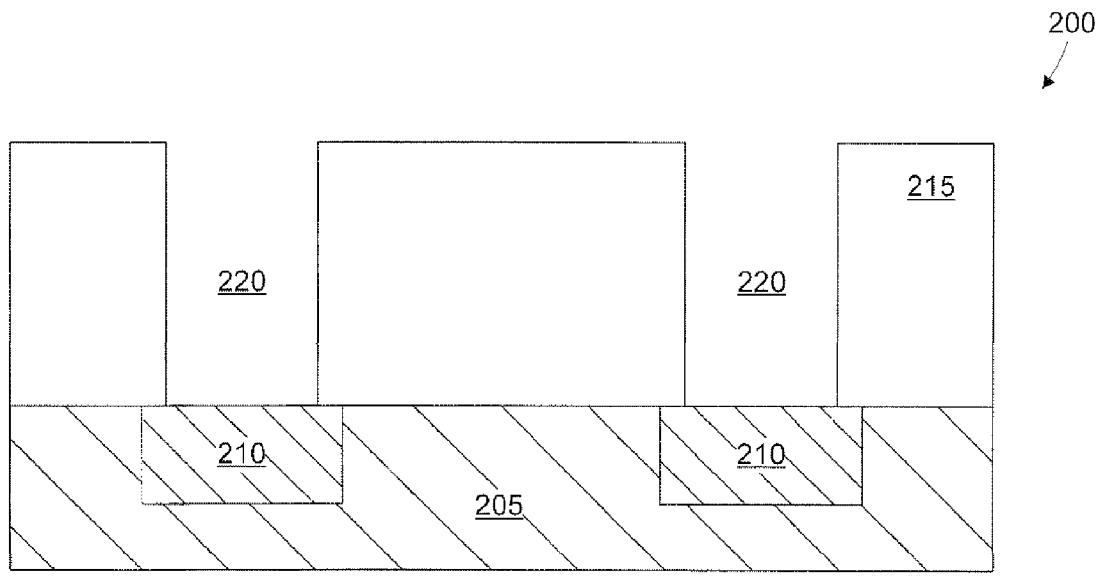
FIGS. 2a-2f are cross-section views illustrating the formation of a metal silicide interconnect structure accordance with another embodiment of the present subject matter.

Following removal of the remaining portions of the metal layer 165 in FIG. 1e, processing may continue in a conventional manner to complete fabrication of the device 100. Silicide interconnect structures may also be used in the subsequently formed metallization layers, as described in greater detail with reference to FIGS. 2a-2f. In FIG. 2a, a semiconductor device 200 includes a first layer 205 having conductive regions 210 formed therein. A dielectric layer 215 is formed over the first layer 205 and patterned to define openings 220 exposing the conductive regions 210. For example, the conductive regions 210 may represent underlying contacts, vias, or metal lines. In the embodiment illustrated in FIG. 2a, the opening 220 is employed to define an interconnect structure, such as a via for connecting the conductive regions 210 to a subsequently formed upper layer. Although a via is illustrated, a dual damascene process may also be employed to define openings for a via and a trench, or just a trench, depending on the particular application.

Figure 2B:
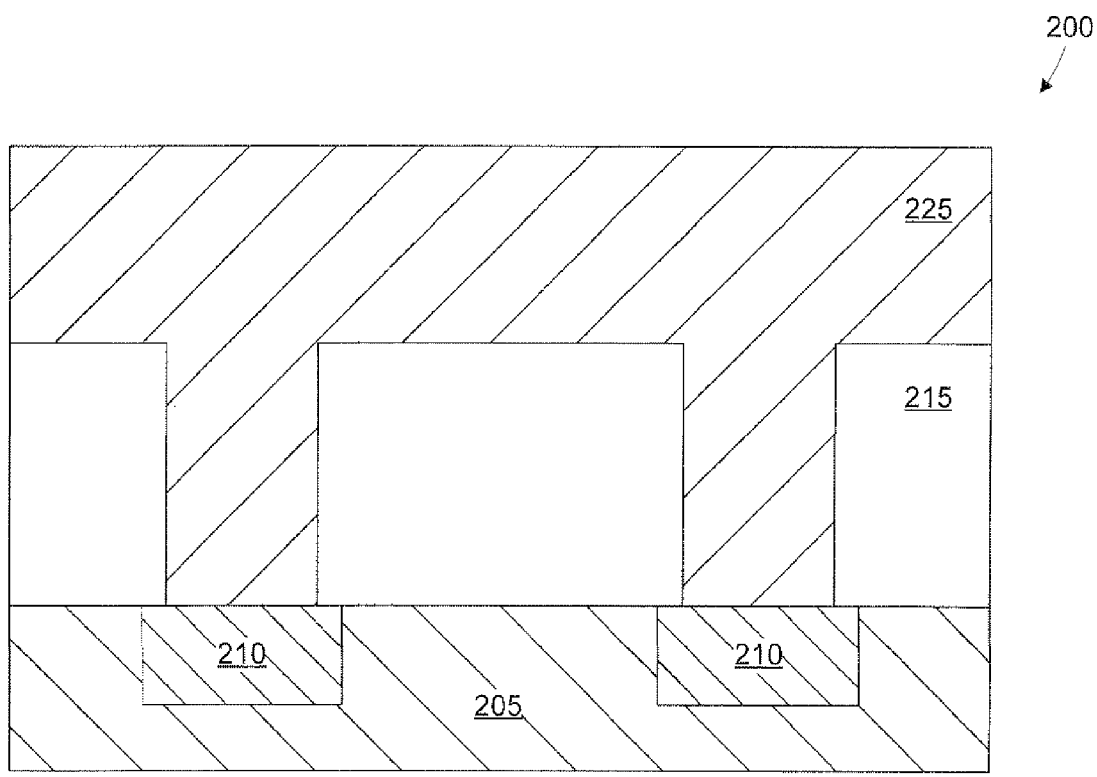
Figure 2C:
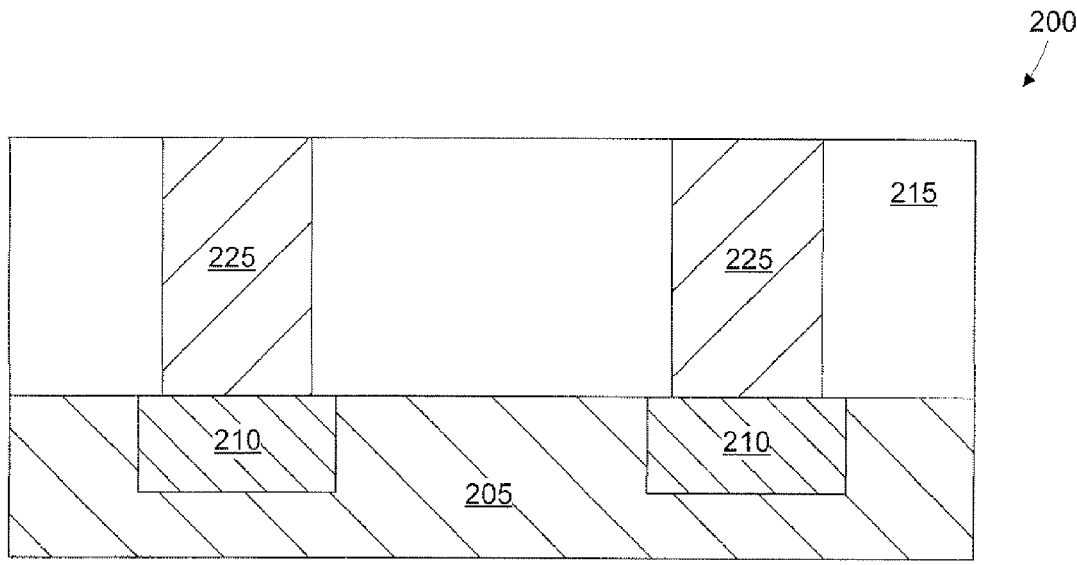
Figure 2D:
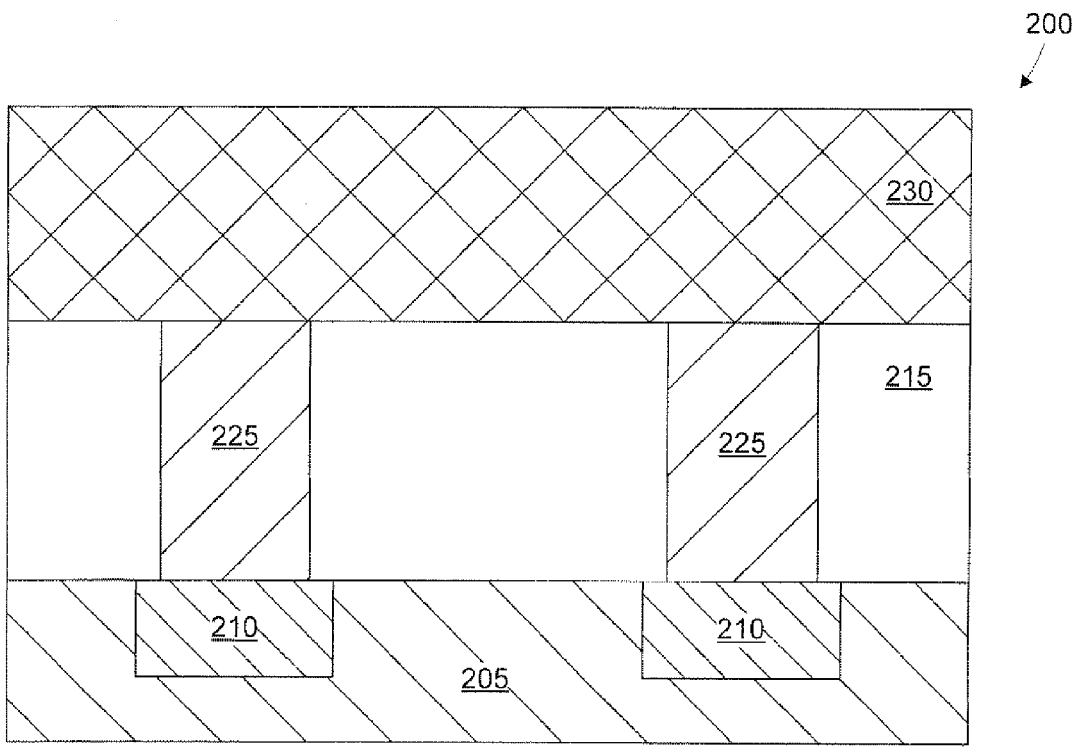

As shown in FIG. 2b, a silicon layer 225 is formed over the dielectric layer 215 using a process such as chemical vapor deposition (CVD). Again a barrier material (not shown) may be used to line the opening 220 prior to forming the silicon layer depending on the particular silicide that is to be later formed. The silicon layer 225 may take the form of polysilicon or amorphous silicon. The silicon layer 225 fills the opening 220. Subsequently, a planarization process, such as chemical mechanical planarization (CMP), is employed as shown in FIG. 2c to remove portions of the silicon layer 225 extending beyond the opening 220. The thickness of the silicon layer 225 may be controlled depending on the dimensions of the dielectric layer 215 and the opening 220 to provide for adequate fill.

As shown in FIG. 2c, a metal layer 230 is formed over the dielectric layer 215 and remaining portions of the silicon layer 225 utilizing a deposition process including, but not limited to, sputtering, evaporating, plating, CVD, atomic layer deposition, or chemical solution deposition. As described previously, the material and thickness of the metal layer 230 may vary depending on the particular silicide material desired.

Figure 2E:
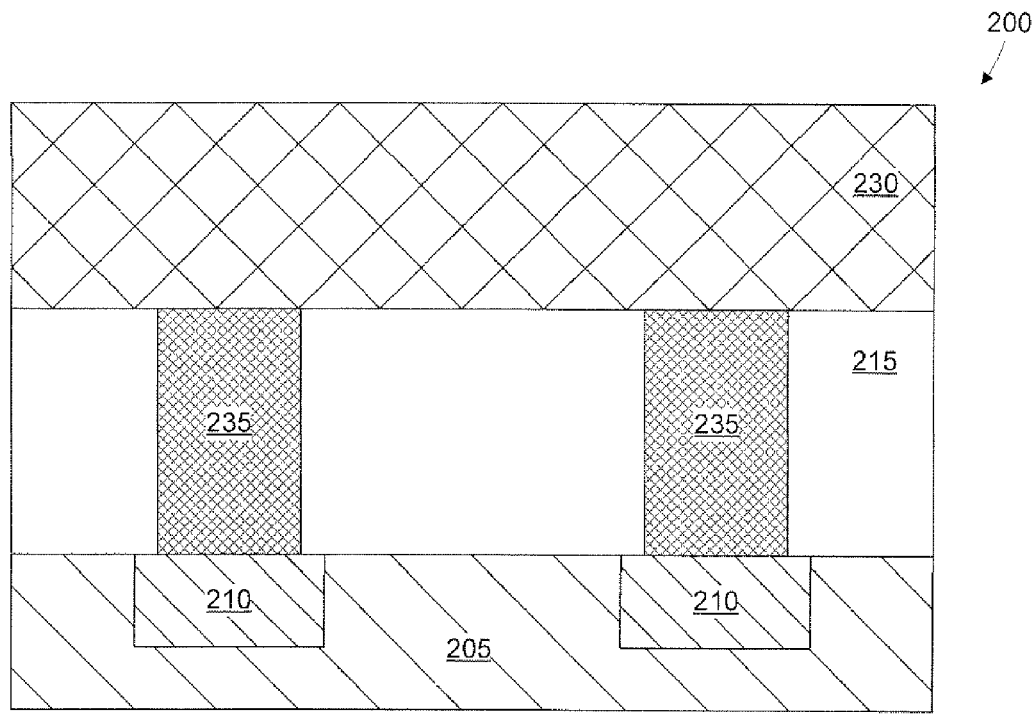
Figure 2F:
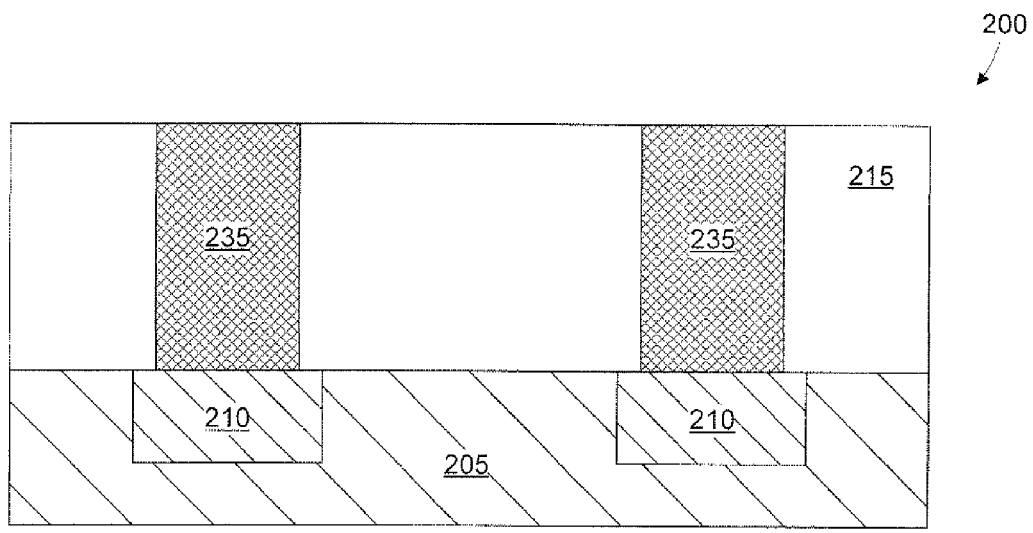

The semiconductor device 200 is subjected to an annealing process in FIG. 2e to convert the material of the silicon layer 225 to a metal silicide 235, and the unreacted portions of the metal layer 230 are removed as shown in FIG. 2f using, for example, a wet etch. Again, the particular form of silicide may vary depending on the metal selected and the characteristics of the annealing process.

In some instances, the aspect ratios of the interconnect features may make it difficult to provide for complete conversion of the silicon material used to fill the interconnect opening to silicide. It may also be useful to eliminate the need to perform the wet etch to remove unreacted metal portions, thereby reducing the possibility of damaging the dielectric layer 215, for example, when an ultra-low dielectric constant (ULK) material is used.

Figure 3A:
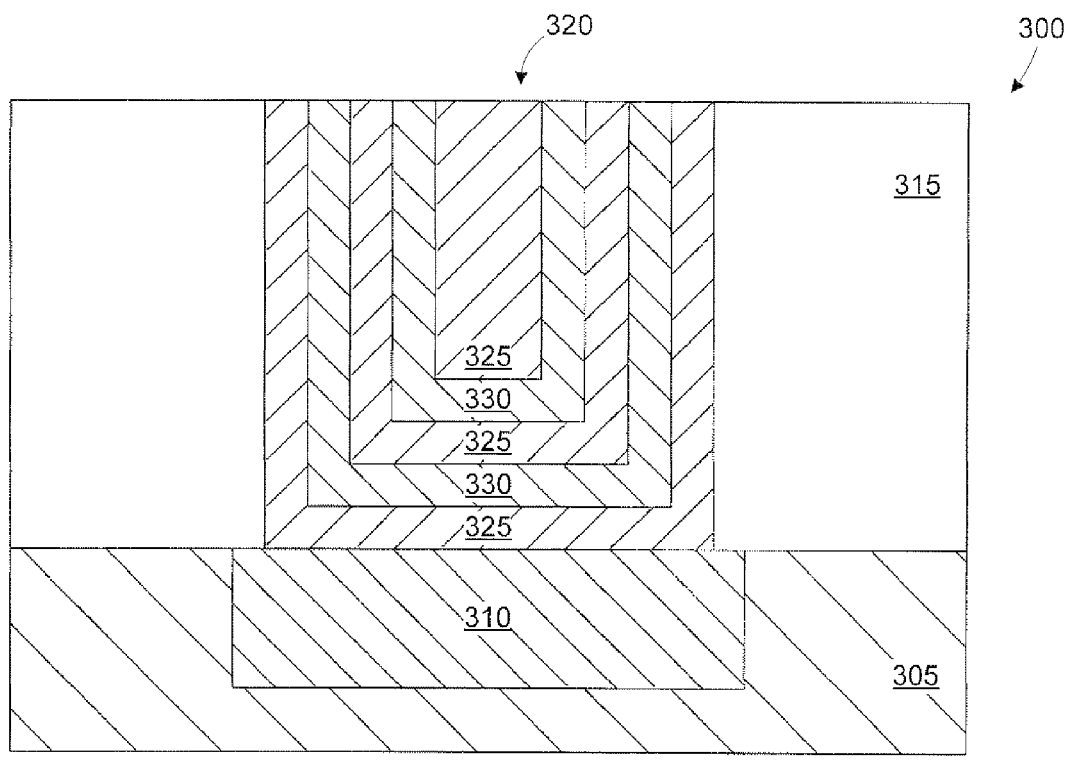
FIGS. 3a-3b are cross-section views illustrating the formation of a metal silicide interconnect structure in accordance with yet another embodiment of the present subject matter.

To that end, FIG. 3a illustrates a semiconductor device 300 including a first layer 305 having a conductive region 310 formed therein. A dielectric layer 315 is formed over the first layer 305 and patterned to define an opening 320 exposing the conductive region 310. For example, the conductive region 310 may be an underlying contact, via, or metal line. In the embodiment illustrated in FIG. 3a, the opening defines an interconnect structure, such as a via for connecting the conductive region 310 to a subsequently formed upper layer. Although a via is illustrated, a dual damascene process may also be employed to define opening for a via and a trench, or just a trench, depending on the particular application. The opening 320 has been filled with alternating silicon layers 325 and metal layers 330 and planarized to remove portions of the layers 325, 330 extending beyond the opening 320. The thickness and number of silicon layers 325 and metal layer 330 may be controlled depending on the dimensions of the dielectric layer 215 and the opening 220 to provide for adequate fill and to provide adequate metal quantities to allow subsequent conversion to metal silicide.

Figure 3B:
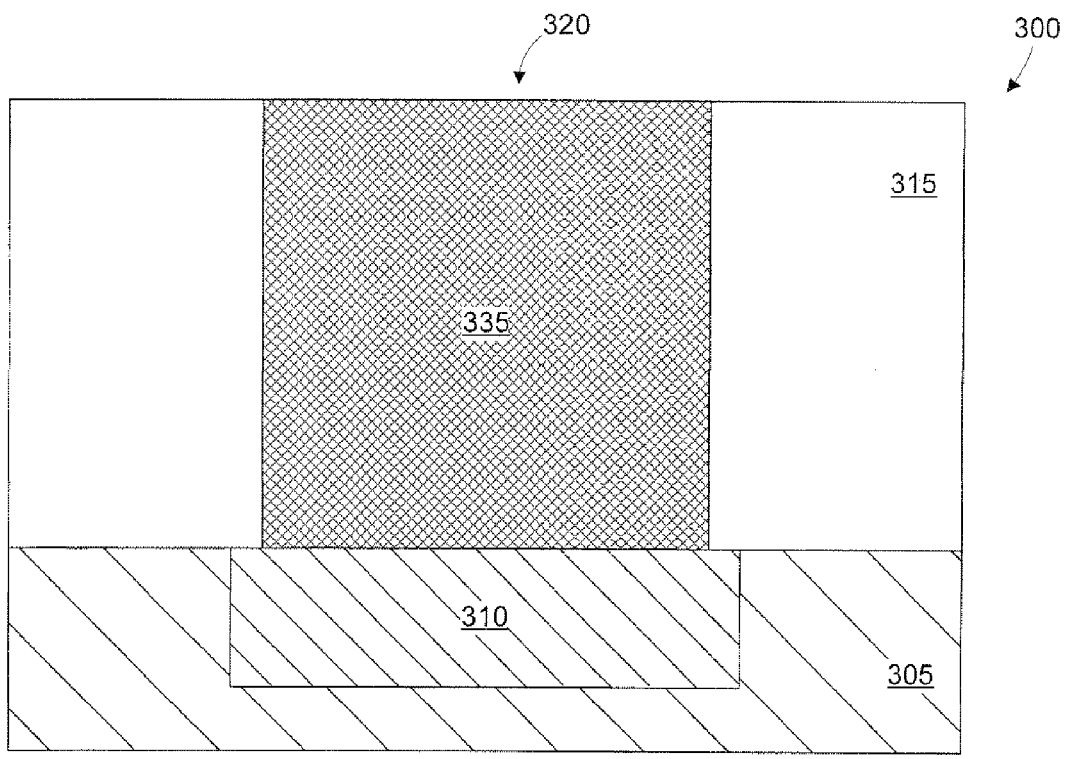

In FIG. 3b, the semiconductor device 300 is subjected to an annealing process to convert the material of the silicon layers 325 and metal layers 330 to a metal silicide 335. Generally, metal from the metal layers 330 migrates to the silicon layers 325, and silicon from the silicon layers 325 migrates to the metal layers 330 to provide a substantially homogeneous metal silicide 335 that fills the opening 320. Because silicide 335 does not extend beyond the opening 320, and no remaining metal exists, a wet etch is not necessary. The use of multiple silicon and metal layers 325, 330 also provides for complete silicide formation in the case where the aspect ratio of the opening 320 might otherwise make it difficult to fully convert the silicon to silicide. It is contemplated that a CMP step may be performed after the silicide anneal to remove any silicide 335 that has formed above the original planarized surface due to volume expansion.

The interconnect structures described herein provide for low resistance and avoid some of the processing difficulties associated with the use of conventional interconnect materials, such as tungsten or copper. The need for barrier materials may be eliminated in some applications, resulting in improved scaling capability. The processes for forming the interconnect features may also be integrated into conventional process flow structures that employ damascene techniques for forming contacts, vias, and/or trenches in metallization layers. Although not illustrated, further processing of the semiconductor devices 100, 200, 300 of FIGS. 1f, 2f, and 3b, respectively, may be conducted to form an additional layer above the interconnect layer that interface with the metal silicide interconnect structure to communicate between layers. Although the present subject matter has been described as it may be applied to a silicon-based semiconductor environment, it is contemplated that the silicide-based interconnects described herein may include other types of applications, such as phase-change memory (PCM) devices, magnetoresistive random access memory (MRAM), ultra-small technologies, etc.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method for forming an interconnect structure, comprising:
    forming a dielectric layer above a first layer having a conductive region defined therein;
    defining an opening in the dielectric layer to expose at least a portion of the conductive region;
    forming a silicon layer above the dielectric layer, the silicon layer filling the opening;
    forming a metal layer above the silicon layer; and
    performing an annealing process to substantially convert all of the silicon layer disposed within the opening to a metal silicide to define the interconnect structure.

2. The method of claim 1, further comprising planarizing the silicon layer to remove a portion of the silicon layer extending beyond the opening prior to forming the metal layer, and wherein forming the metal layer further comprises forming the metal layer above remaining portions of the silicon layer.

3. The method of claim 1, further comprising removing an unreacted portion of the metal layer.

4. The method of claim 3, wherein removing the unreacted portion of the metal layer comprises performing a wet etch.

5. The method of claim 1, wherein forming the silicon layer comprises forming one of a polysilicon layer or an amorphous silicon layer.

6. The method of claim 1, wherein forming the metal layer comprises forming a nickel-containing layer.

7. The method of claim 1, wherein forming the metal layer comprises forming a nickel-platinum alloy layer.

8. The method of claim 1, wherein performing the annealing process comprises performing the annealing at a temperature in the range of about 300 degrees Celsius to about 500 degrees Celsius.

9. The method of claim 1, wherein forming the metal silicide further comprises:
    forming at least one silicon layer above the dielectric layer;
    forming at least one metal layer over the first silicon layer and at least partially disposed within said opening, the combination of the at least one silicon layer and at least one metal layer filling the opening;
    planarizing the at least one silicon layer and at least one metal layer to remove portions of the at least one silicon layer and at least one metal layer extending beyond the opening; and
    performing an annealing process to convert substantially all the remaining portions of the at least one silicon layer and at least one metal layer to the metal silicide.

10. The method of claim 1, wherein defining the opening in the dielectric layer further comprises defining a via opening and a trench opening.

11. The method of claim 1, wherein the conductive region comprises a transistor contact region, and defining the opening in the dielectric layer further comprises defining a contact opening.

12. The method of claim 11, wherein the transistor contact region comprises one of a source contact region, a drain contact region, or a gate contact region.

13. The method of claim 1, wherein the metal silicide comprises nickel monosilicide.

14. A method for forming an interconnect structure, comprising:
    forming a dielectric layer above a first layer having a conductive region defined therein;
    defining an opening in the dielectric layer to expose at least a portion of the conductive region; and
    forming a silicon layer above the dielectric layer, the silicon layer filling the opening;
    planarizing the silicon layer to remove a portion of the silicon layer extending beyond the opening;
    forming a metal layer above remaining portions of the silicon layer;
    performing an annealing process to convert the remaining portions of the silicon layer to metal silicide; and
    removing an unreacted portion of the metal layer.

15. The method of claim 14, wherein the metal silicide comprises nickel monosilicide.

16. The method of claim 14, wherein the metal layer comprises a nickel-platinum alloy.

* * * * *